United States Patent [19]

Okuda

[11] Patent Number: 5,590,050
[45] Date of Patent: Dec. 31, 1996

[54] DEVICE FOR AID IN INTEGRATED CIRCUIT DESIGN THAT REDUCES THE NUMBER OF CELLS IN A CIRCUIT REPRESENTATION

[75] Inventor: Ryosuke Okuda, Itami, Japan

[73] Assignee: Mitsubishi Denki Kabushiki Kaisha, Tokyo, Japan

[21] Appl. No.: 196,365

[22] Filed: Feb. 15, 1994

[30] Foreign Application Priority Data

Feb. 24, 1993 [JP] Japan .................................. 5-058086

[51] Int. Cl.$^6$ .................................................. H01L 21/70
[52] U.S. Cl. ........................................................... 364/490
[58] Field of Search .................................. 364/488, 489, 364/490, 491, 578

[56] References Cited

U.S. PATENT DOCUMENTS

| | | | |
|---|---|---|---|
| 4,377,849 | 3/1983 | Finger et al. | 364/491 |
| 4,656,603 | 4/1987 | Dunn | 364/900 |
| 4,701,860 | 10/1987 | Mader | 364/490 |
| 5,231,590 | 7/1993 | Kumar et al. | 364/491 |
| 5,377,122 | 12/1994 | Werner et al. | 364/488 |
| 5,438,524 | 8/1995 | Komoda | 364/489 |

OTHER PUBLICATIONS

ACM/IEEE 18th Design Automation Conference Proceedings, 1981, Chiyoji Tanaka, et al., "An Integrated Computer Aided Design System For Gate Array Masterslices: Part 1. Logic Reorganization System Lores–2", pp. 59–65.

A Cell Placement Procedure that Utilizes Circuit Structure Properties, IEEE 1993.

Integrated Placement for Mixed Macro Cell and Standard Cell Designs, IEEE 1990.

Finding Optimal Module Orientations in Macro Cell Placement, IEEE 1991.

*Primary Examiner*—Kevin J. Teska
*Assistant Examiner*—Dan Fiul
*Attorney, Agent, or Firm*—Oblon, Spivak, McClelland, Maier & Neustadt, P.C.

[57] ABSTRACT

There is disclosed a device for aiding in designing a semiconductor integrated circuit wherein a circuit converter converts a circuit to be subjected to automatic placement and routing which is stored in a circuit storage into a new cell which is then registered in a cell library storage by a cell generator while the changed circuit is stored in an equivalent circuit storage in the form of an equivalent circuit, on the basis of which a circuit verifier stimulates a circuit operation. A placement and routing unit performs cell placement of the equivalent circuit and cell-to-cell routing by using the cell library storage storing the specification of the new cell, whereby the integrated circuit having good performances such as area, operating speed, and power consumption is designed without difficulty.

26 Claims, 9 Drawing Sheets

| | CIRCUIT SYMBOL | CIRCUIT DIAGRAM | DELAY TIME |
|---|---|---|---|
| CELL 50 | A—▷o—Y | | A→Y 2nSEC |
| CELL 51 | A,B—NAND—Y | | A→Y 3nSEC<br>B→Y 3nSEC |
| CELL 52 | A,B—AND—Y | | A→Y 5nSEC<br>B→Y 5nSEC |
| CELL 53 | A,B—NOR—Y | | A→Y 3nSEC<br>B→Y 3nSEC |
| CELL 54 | A,B—OR—Y | | A→Y 5nSEC<br>B→Y 5nSEC |

*FIG. 2*

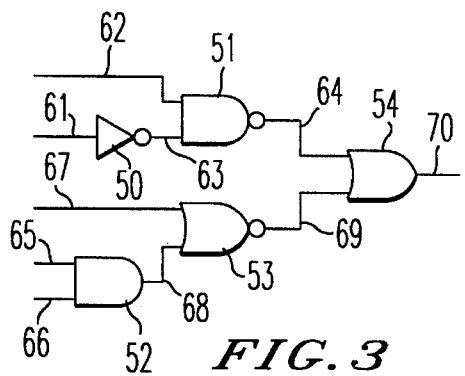
*FIG. 3*
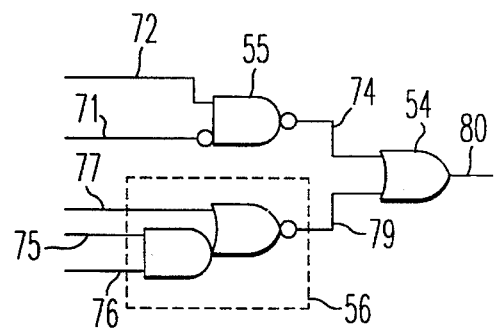
*FIG. 5*
| | CIRCUIT SYMBOL | CIRCUIT DIAGRAM | DELAY TIME |
|---|---|---|---|
| CELL 55 | A—⟫o—Y B— | (circuit diagram) | A→Y 3nSEC B→Y 5nSEC |
| CELL 56 | A— B—⟫o—Y C— | (circuit diagram) | A→Y 3nSEC B→Y 3nSEC C→Y 3nSEC |
*FIG. 4*

5,590,050

DEVICE FOR AID IN INTEGRATED CIRCUIT DESIGN THAT REDUCES THE NUMBER OF CELLS IN A CIRCUIT REPRESENTATION

BACKGROUND OF THE INVENTION

1. Field of the Invention

The present invention relates to a device for automatically designing a semiconductor integrated circuit which receives a circuit made by using cells provided in a cell library and performs automatic placement and routing of the cells to design the integrated circuit.

2. Description of the Background Art

FIG. 14 is a block diagram of a conventional device for automatically designing a semiconductor integrated circuit. In FIG. 14, the reference numeral 1 designates a cell library storage for storing data indicative of cells including logic gates such as NAND gates, inverters and the like; 2 designates a circuit storage for representing a circuit desired to be achieved by connection between cells; 3 designates a circuit verifier for simulating a circuit operation to verify it; 4 designates a placement and routing unit for positioning respective cells and interconnecting lines between the cells on an integrated circuit chip; and 5 designates a layout storage for storing information about the positions of the cells and interconnecting lines.

In operation, pre-designed cell data are stored in the cell library storage 1, and data about the circuit desired to be achieved in the form of an integrated circuit are stored in the circuit storage 2. This circuit is required to have only the cells connected to each other and included in the cell library storage 1. The circuit verifier 3 verifies whether or not the circuit stored in the circuit storage 2 operates correctly by means of the respective data of the cell library storage 1 and circuit storage 2. If the correctness of the circuit becomes clear as a result of the verification, the placement and routing unit 4 determines the positions of the respective cells and interconnecting lines on the integrated circuit chip by means of the circuit data to output the resultant information to the layout storage 5.

The conventional device for automatically designing a semiconductor integrated circuit as above constructed is difficult to attain required target values of the area, operating speed and power consumption of the designed integrated circuit in some cases. One of the reasons for the difficulty is that a circuit most adapted for the desired function is not necessarily provided because the data of the cells for use in the circuit are restricted to those provided in the cell library storage 1. Furthermore, long interconnecting lines for some connections as a result of the placement and routing result in substantial area, a long signal propagation time and large power consumption of the lines.

SUMMARY OF THE INVENTION

The present invention is intended for a device for automatically designing a semiconductor integrated circuit, the device including a placement and routing unit for determining the arrangement of cells and lines on an integrated circuit chip on the basis of data of cells stored in a cell library storage and data of a circuit stored in a circuit storage. According to the present invention, the device comprises: a circuit converter for generating an equivalent circuit having cells smaller in total number than those of the circuit by the use of a new cell which is not stored in the cell library storage on the basis of the circuit formed by connecting only the cells stored in the cell library storage to apply the data of the equivalent circuit to the placement and routing unit, the circuit converter producing a specification of the new cell; and a cell generator for producing data required to register the new cell in the cell library storage on the basis of the new cell specification.

The circuit converter of the present invention converts the data of the circuit stored in the circuit storage into the equivalent circuit having a smaller total number of cells by using the new cell which is not stored in the cell library. Since the cells in the equivalent circuit are smaller in number than those in the original circuit, the number of lines interconnecting the cells is reduced. The cell generator produces the new cell data such that the new cell generated by the circuit converter is registered in the cell library storage. The data of the new cell is registered in the cell library to permit the subsequent processing.

A semiconductor integrated circuit designed by the device of the present invention has a small number of cells and lines, thereby increasing the operating speed and reducing the power consumption as well as reducing an area of the integrated circuit chip. This is effective in improving the performances of the integrated circuit to be finally provided.

Preferably, the circuit converter includes: a path analyzer for analyzing a signal propagation delay time for all paths in the circuit; a net searcher for searching for a net having a smaller fan-out than a predetermined fan-out on a path having a longer signal propagation delay time than a predetermined delay time; and a cell replacement unit for changing a part of the circuit such that all of the cells connected to the searched net are replaced with the new cell.

The circuit converter need not consider the circuit logic but should only analyze the path delay, permitting high-speed operation. Further, the lines connecting some cells are converted into internal lines of the new cell, thereby ensuring the reduction of lines interconnecting the cells and permitting high-speed operation.

This is effective in designing the integrated circuit of good performances in a short time.

It is an object of the present invention to provide a device for automatically designing a semiconductor integrated circuit having good performances in terms of area, operating speed and power consumption while having the conventional device advantage of automatically positioning cells and interconnecting lines on receipt of a circuit formed by connecting cells provided in a cell library storage.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows cell data stored in a cell library storage shown in FIG. 1;

FIG. 3 is a logic circuit diagram of a part of a circuit stored in a circuit storage shown in FIG. 1;

FIG. 4 shows cell data produced by a circuit converter shown in FIG. 1;

FIG. 5 is a logic circuit diagram of a part of a circuit stored in an equivalent circuit storage shown in FIG. 1;

DESCRIPTION OF THE PREFERRED EMBODIMENTS

Figure 1:
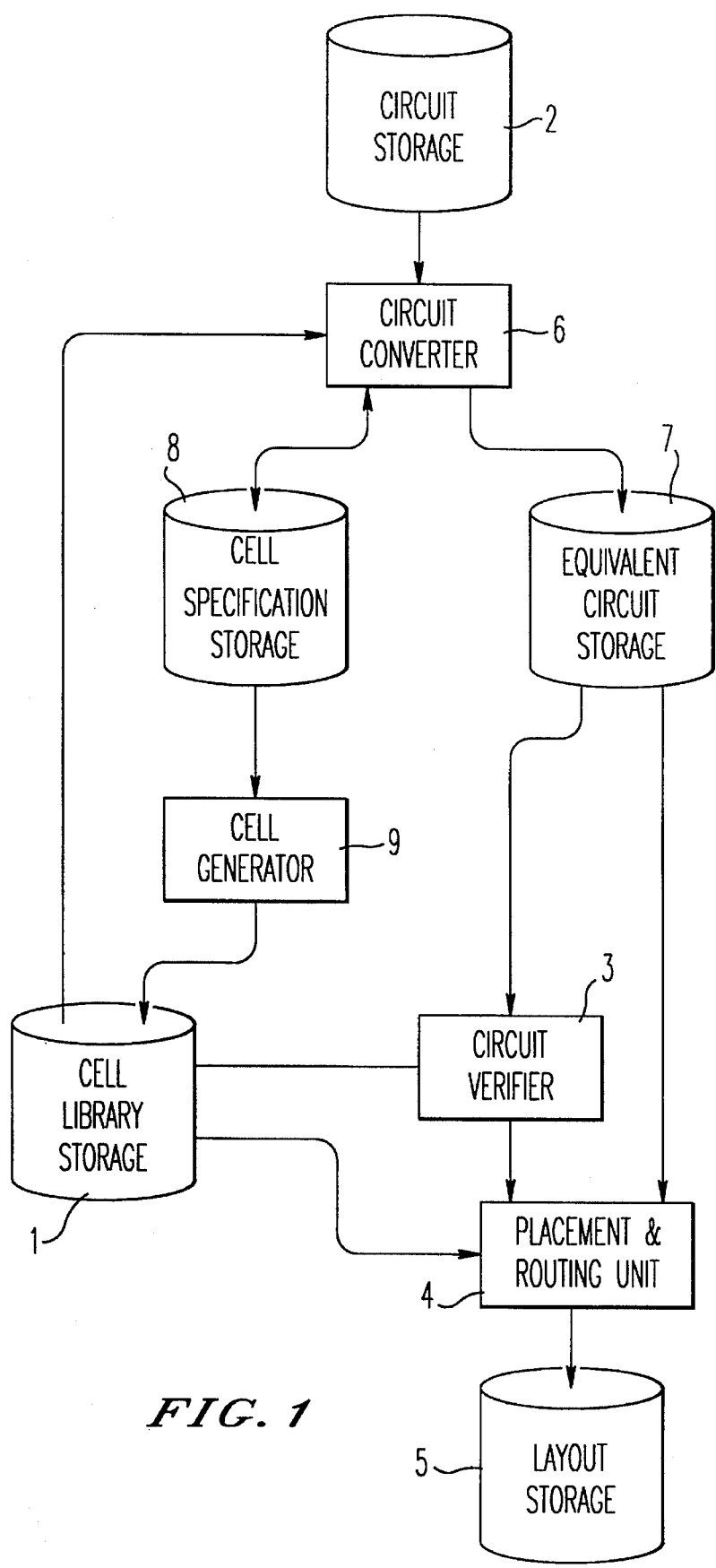
FIG. 1 is a block diagram of a device for automatically designing a semiconductor integrated circuit according to a preferred embodiment of the present invention.

A preferred embodiment according to the present invention will now be described with reference to FIG. 1. In FIG. 1, the reference numeral 1 designates a cell library storage for storing data indicative of cells including logic gates such as NAND gates, inverters and the like; 2 designates a circuit storage for representing a circuit desired to be achieved by connection between cells; 6 designates a circuit converter for converting a part of the circuit stored in the circuit storage 2 into an equivalent circuit using a new cell which is not provided in the cell library 1; 8 designates a cell specification storage for storing specification data of the new cell outputted from the circuit converter 6; 9 designates a cell generator for generating cell data from the new cell specification data stored in the cell specification storage 8 to output the data to the cell library storage 1; 7 designates an equivalent circuit storage for storing and outputting the equivalent circuit; 3 designates a circuit verifier for simulating a circuit operation to verify the equivalent circuit, when the data of the equivalent circuit outputted from the equivalent circuit storage 7 is achieved by means of the data of the cells stored in the cell library storage 1; 4 designates a placement and routing unit for positioning the cells stored in the cell library storage 1 and interconnecting lines between the cells on an integrated circuit in consideration for the verification result of the circuit verifier 3 in the equivalent circuit outputted from the equivalent circuit storage 7; and 5 designates a layout storage for storing information about the positions of the cells and interconnecting lines which is outputted from the placement and routing unit 4.

The cell library storage 1 stores data about cells (circuit symbol, circuit diagram, delay time and the like) as shown in FIG. 2. For purposes of simplification, the cell library storage 1 is assumed to have only the data of FIG. 2 stored therein.

The cell generator 9 is disclosed in, for example, Ryosuke Okuda, Sumino Oguri; "An Efficient Routing Algorithm for SOG Cell Generation on a Dense Gate-Isolated Layout Style", Proc. of 29th D.A.C., pp.676–681, 1992.

Figure 14:
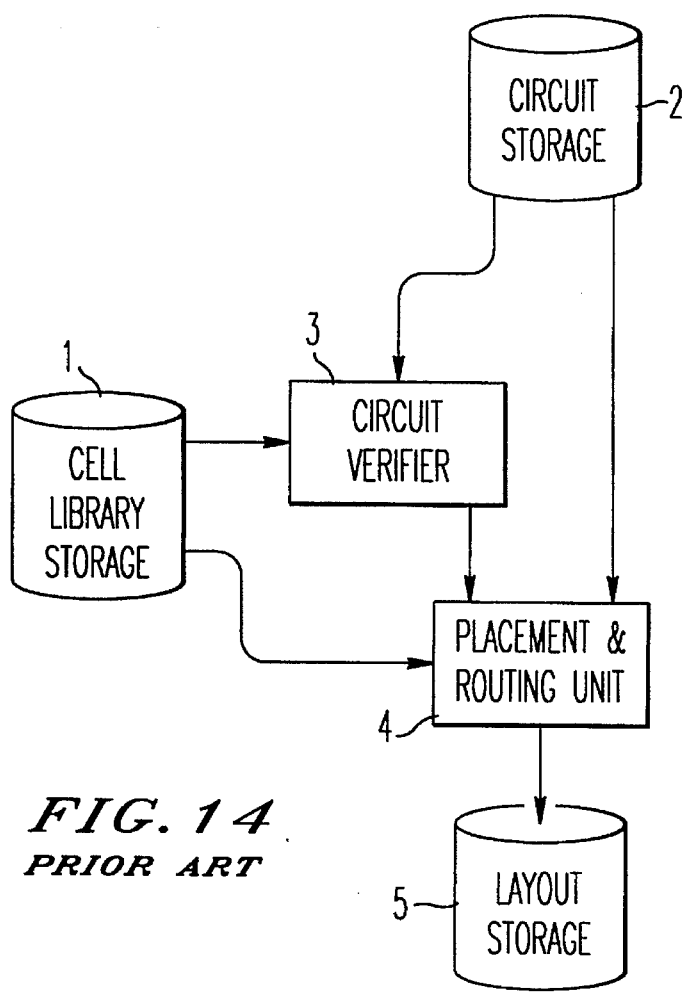
FIG. 14 is a block diagram of a conventional device for automatically designing a semiconductor integrated circuit.

Operation is discussed below. In the device for automatically designing a semiconductor integrated circuit according to the present invention, predesigned cell data are stored in the cell library storage 1, and data about the circuit desired to be achieved in the form of an integrated circuit are stored in the circuit storage 2, similarly to the conventional device of FIG. 14. The circuit converter 6 reads the circuit data stored in the circuit storage 2 and replaces a part of the circuit with an equivalent circuit using a new cell which is not stored in the cell library storage 1. The replacement is described below with reference to FIGS. 3 and 5.

FIG. 3 is a logic circuit diagram of a part of a circuit desired to be achieved in the form of an integrated circuit. In FIG. 3, the reference numeral 50 designates an NOT gate for performing a negative Boolean operation on an input 61; 51 designates an NAND gate for performing a Boolean operation of negative logical product on an input 62 and an input 63 outputted from the NOT gate 50; 52 designates an AND gate for performing a Boolean operation of logical product on inputs 65 and 66; 53 designates an NOR gate for performing a Boolean operation of negative logical sum on an input 67 and an input 68 outputted from the AND gate 52; and 54 designates an OR gate for performing a Boolean operation of logical sum on an input 64 outputted from the NAND gate 51 and an input 69 outputted from the NOR gate 53 to provide an output 70.

It is assumed, for instance, that the desired circuit including the circuit of FIG. 3 is stored in the circuit storage 2. The circuit converter 6 combines the cells 50 and 51 to produce a cell 55 shown in FIG. 4, thereby to form the desired circuit by means of the cell 55 in place of the cells 50 and 51 as shown in FIG. 5. Likewise, the circuit converter 6 combines the cells 52 and 53 to produce a cell 56 shown in FIG. 4, thereby to form the desired circuit by means of the cell 56 in place of the cells 52 and 53 as shown in FIG. 5.

Equivalent circuit data of the desired circuit including the circuit of FIG. 5 are provided to the equivalent circuit storage 7 whereas the new cell specification data are provided to the cell specification storage 8. This is carried out such that the cells included in the equivalent circuit are smaller in number than the cells included in the original circuit. Thus, connections and logic gates included in the equivalent circuit are smaller in number than those included in the original circuit.

The cell generator 9 reads specifications of all cells stored in the cell specification storage 8 to generate and output cell data required for the circuit verifier 3 and placement and routing unit 4 to the cell library storage 1. After the circuit verifier 3 verifies the correctness of the circuit in the equivalent circuit storage 7, the placement and routing unit 4 determines the positions of the cells and interconnecting lines for the circuit in the equivalent circuit storage 7, and the position data are outputted to the layout storage 5.

Figure 6:
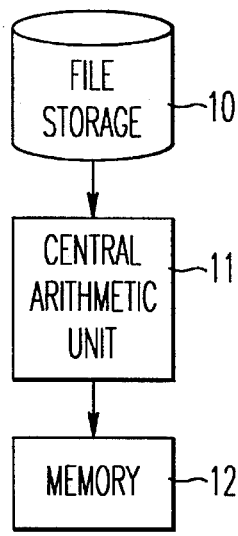
FIG. 6 is a block diagram of the device of the preferred embodiment which is implemented by means of a computer.

Although the respective units 1 to 8 are discrete in the preferred embodiment, a general-purpose computer may be used instead which comprises a file storage 10, a central arithmetic unit 11, and a memory 12 as shown in FIG. 6.

In the computer of FIG. 6, the circuit verifier 3, placement and routing unit 4, circuit converter 6 and cell generator 9 of FIG. 1 are implemented in the form of a program executed by the central arithmetic unit 11, and the cell library storage 1, circuit storage 2, layout storage 5, equivalent circuit storage 7 and cell specification storage 8 of FIG. 1 are implemented in the form of the file storage 10 and memory 12.

Figure 7:
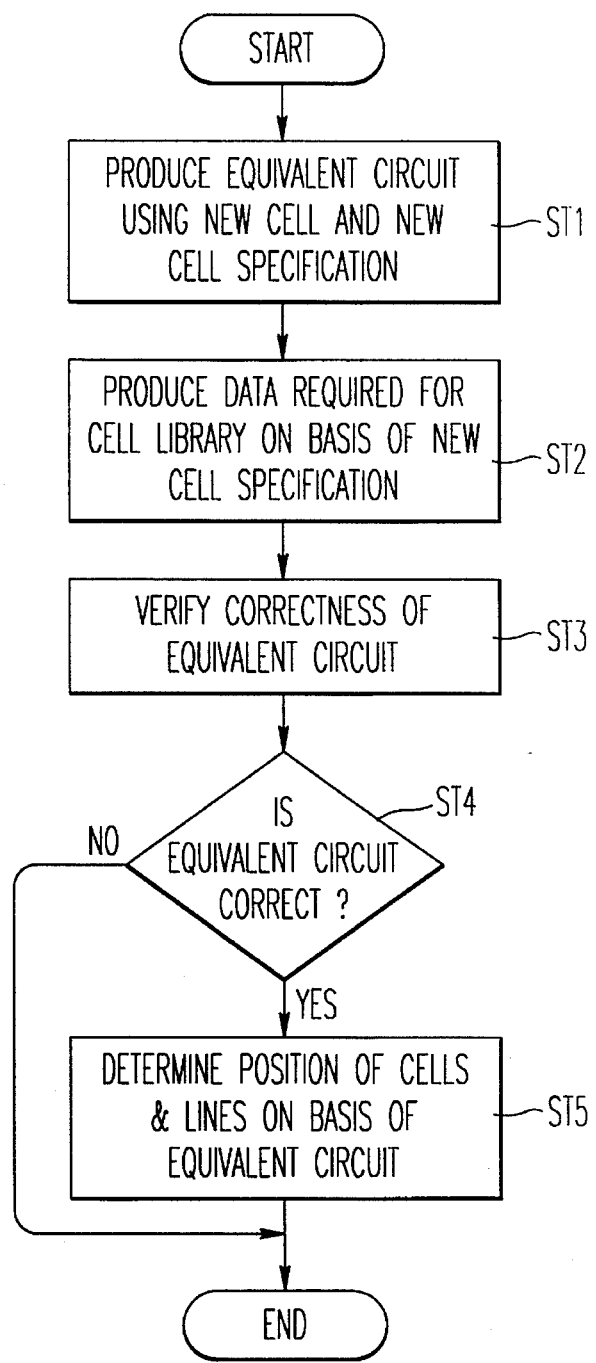
FIG. 7 is a flow chart showing the operation of a CPU shown in FIG. 6.

The operation of the central arithmetic unit 11 is discussed hereinafter with reference to the flow chart of FIG. 7. Starting the flow of FIG. 7, the entered circuit is converted into the equivalent circuit using the data of the new cell which is not present in the cell library storage 1 and the new cell specification is produced in the step ST1. That is, the circuit having only the cells connected to each other and provided in the cell library storage 1 is converted into the equivalent circuit using the new cell which is not present in the cell library storage 1 and having a smaller total number of cells, and the new cell specification is produced.

Data about all new cells required for the cell library are produced in the step ST2. In the step ST3, the correctness of the equivalent circuit is verified.

In the step ST4, whether the equivalent circuit is correct is judged from the result of the verification of the step ST3. If it is not judged that the equivalent circuit is correct in the step ST4, the processing is terminated. If it is judged so, the flow proceeds from the step ST4 to the step ST5. The positions of the cells and interconnecting lines in the equivalent circuit on the integrated circuit chip are determined in the step ST5.

Figure 8:
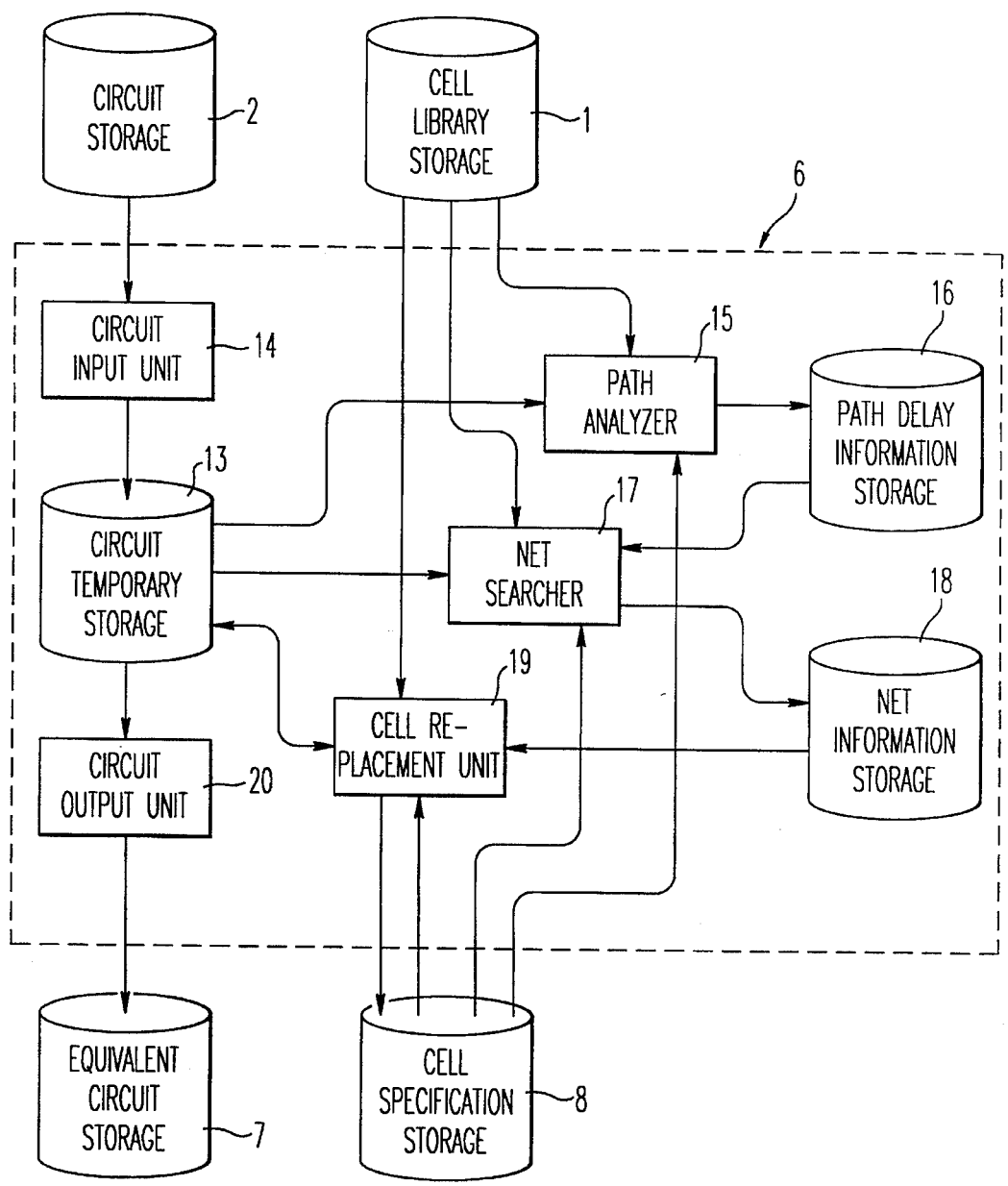
FIG. 8 is a detailed block diagram of the circuit converter of FIG. 1.

FIG. 8 is a block diagram of an exemplary arrangement of the circuit converter 6 in the device of FIG. 1 according to the preferred embodiment of the present invention. In FIG. 8, the reference numerals 1, 2, 6 to 8 designate portions having the same functions as those of FIG. 1. The reference numeral 13 designates a circuit temporary storage for storing circuit data temporarily; 14 designates a circuit input unit for transferring the circuit data in the circuit storage 2 to the circuit temporary storage 13; 15 designates a path analyzer for analyzing a path delay time for the circuit in the circuit temporary storage 13 by means of the cell data stored in the cell library storage 1 and the cell data stored in the cell specification storage 8; 16 designates a path delay information storage for storing the path delay time data analyzed by the path analyzer 15; 17 designates a net searcher for searching the circuit in the circuit temporary storage 13 for a net with a small fan-out on the path having a long delay time stored in the path delay information storage 16 by using the cell data stored in the cell library storage 1 or the cell data stored in the cell specification storage 8; 18 designates a net information storage for storing net data which are a result of the search by the net searcher 17; 19 designates a cell replacement unit for changing a part of the original circuit in such a manner that the cells connected to the net stored in the net information storage 18 are replaced with a new cell, the changed circuit being outputted to the circuit temporary storage 13, the new cell being outputted to the cell specification storage 8; and 20 designates a circuit output unit for transferring the circuit data in the circuit temporary storage 13 to the equivalent circuit storage 7.

In operation, the circuit input unit 14 transfers to the circuit temporary storage 13 the circuit data in the circuit storage 2 external to the circuit converter 6. For example, it is assumed that a part of the circuit stored in the circuit temporary storage 13 is a circuit shown in the circuit diagram of FIG. 3.

Figure 10:
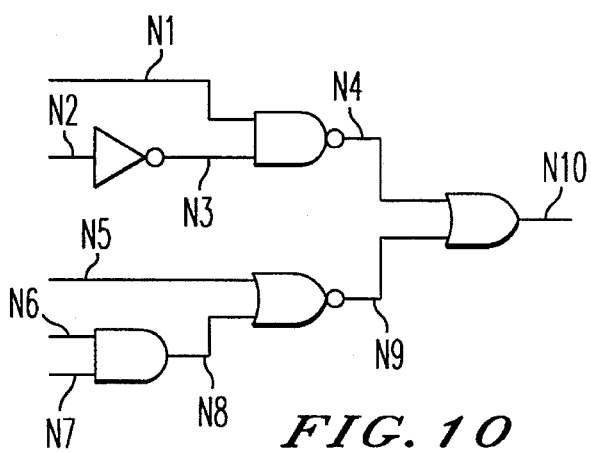
FIG. 10 is a logic circuit diagram for delineating the operation of the circuit converter of FIG. 1.

Upon naming the nets in the circuit stored in the circuit temporary storage 13 as shown in FIG. 10, the path analyzer 15 analyzes the path signal propagation delay time for the circuit data in the circuit temporary storage 13 to produce information about the paths having a long delay time as shown in Table 1, the information being outputted to the path delay information storage 16.

TABLE 1

| path | delay time |
| --- | --- |
| net N6 - cell 52 - net N8 - cell 53 - net N9 - cell 54 - net N10 | 17 n sec. |
| net N7 - cell 52 - net N8 - cell 53 - net N9 - cell 54 - net N10 | 17 n sec. |
| net N2 - cell 50 - net N3 - cell 51 - net N4 - cell 54 - net N10 | 14 n sec. |

The path analyzer 15 is disclosed in, for example, Srinivas Devadas, Kurt Keutzer, Sharad Malik; "Delay Computation in Combinational Logic circuits: Theory and Algorithms", Digest of technical papers ICCAD-91 A Conference for the EE CAD Professional pp. 176–179, November 1991.

The net searcher 17, referring to the information in the path delay information storage 16, searches for nets in the paths having a long delay time on the circuit to select some nets on a basis to be described later, and then outputs the names of the nets to the net information storage 18. The net selection basis is that the fan-out is as small as possible and the size of the cell connected thereto is as small as possible.

Figure 11:
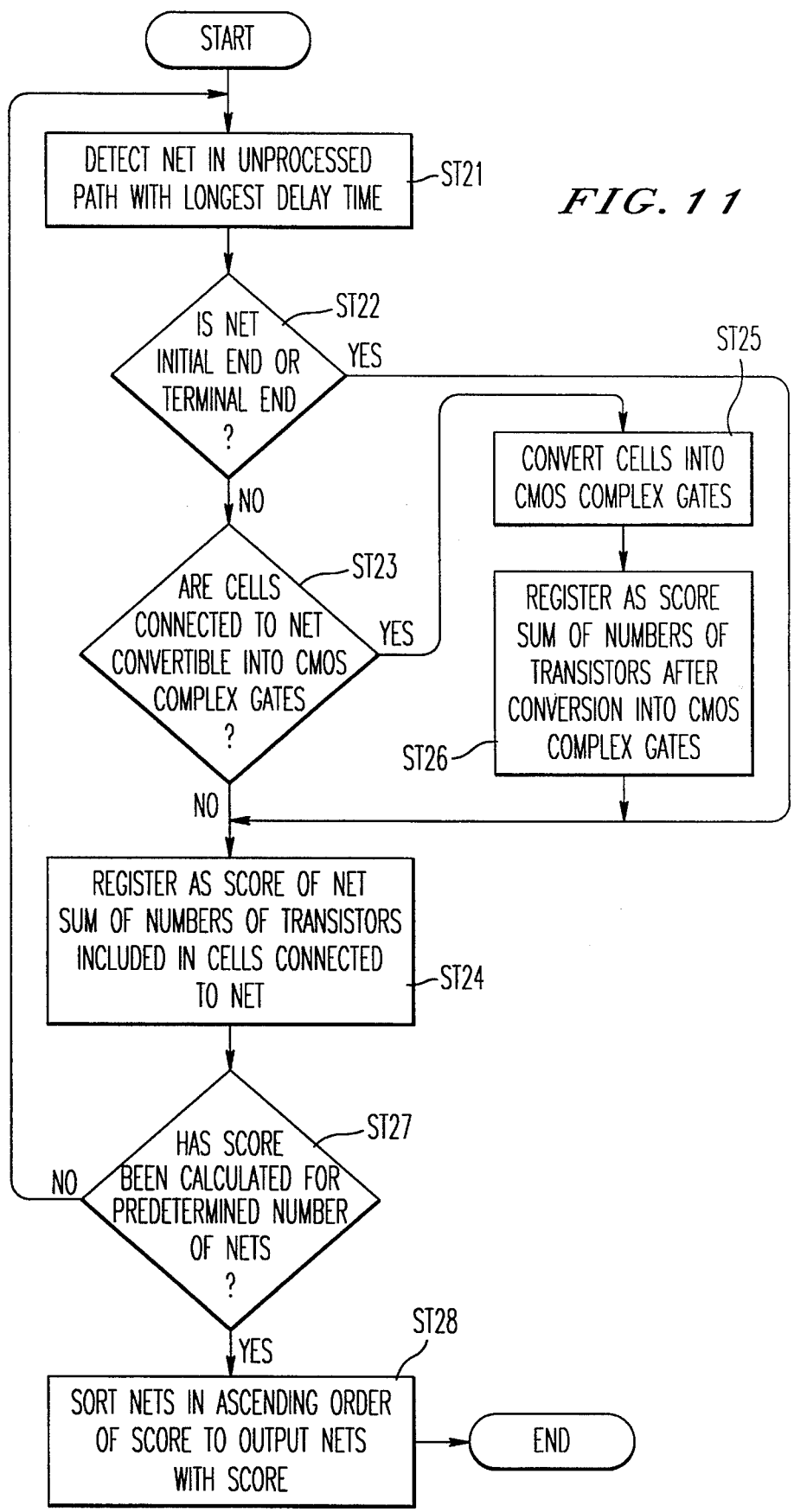
FIG. 11 is a flow chart showing the operation of a path analyzer shown in FIG. 8.

FIG. 11 is a flow chart for detailing the operation of the net searcher 17. A net included in the unprocessed path with the longest delay time stored in the path delay information storage 16 is searched for in the step ST21. Whether the net is neither an initial end nor a terminal end of the path is judged (the step ST22). The initial end is an end of the path at which a signal is entered, and the terminal end is an end of the path at which a signal is outputted. If the net is neither the initial end nor the terminal end of the path, it is then judged whether the cells connected to the net are convertible into CMOS complex gates (the step ST23). If convertible, the cells are converted into the CMOS complex gates (the step S25), and the sum of the numbers of transistors after the conversion into the CMOS complex gates is registered as a score (the step ST26), the flow proceeding to the step ST27. If the cells are not convertible, the sum of the numbers of all transistors included in the cells connected to the net is registered in the form of the score of the net, and the flow proceeds to the step ST24. If the net is either an initial end or a terminal end of the path, the flow proceeds to the step ST27 without the calculation of the net score.

It is judged whether or not the score has been calculated for a predetermined number of nets (whether there are no unprocessed paths left) in the step ST27. If the score has been calculated for the predetermined number of nets, the nets are sorted and outputted in ascending order of score as shown in Table 2 (the step ST28). If the score has not been calculated for the predetermined number of nets, the flow returns to the step ST21 to perform the same processing on the unprocessed paths.

TABLE 2

| net | score |
| --- | --- |
| N8 | 6 |
| N3 | 6 |
| N9 | 10 |
| N4 | 10 |

Figure 12A:
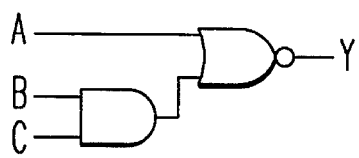
FIGS. 12A and 12B are circuit diagrams for delineating the operation of the path analyzer of FIG. 8.
Figure 12B:
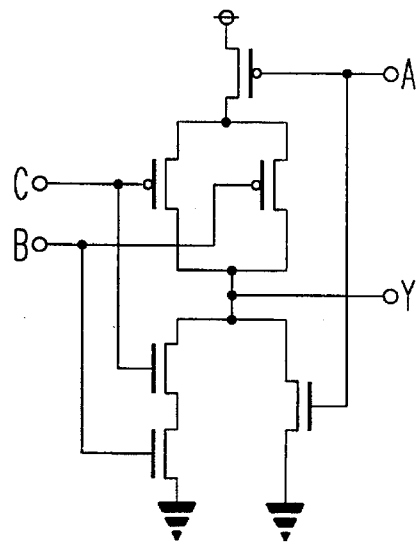

The cells are permitted to be converted into the CMOS complex gates in the following two cases: (1) the output of an AND gate is connected to an input of an NOR gate; and (2) the output of an OR gate is connected to an input of an NAND gate. The case (1) is shown in FIGS. 12A and 12B. FIG. 12A is a logic circuit diagram showing connection of the output of an AND gate to an input of a NOR gate. FIG. 12B is a transistor circuit diagram showing the connection attained by CMOS complex gates.

Following on the net search in the net searcher 17, the cell replacement unit 19 starts the operation. The cell replacement unit 19 changes the circuit data in the circuit temporary storage 13 such that all of the cells connected to the net which satisfy given conditions in the net information storage 18 are replaced with a new cell. The cell replacement unit 19 outputs the new cell specification in the form of its circuit data to the cell specification storage 8. A similar change is made on the circuit in the circuit temporary storage 13 which is changed in the foregoing manner.

Figure 13:
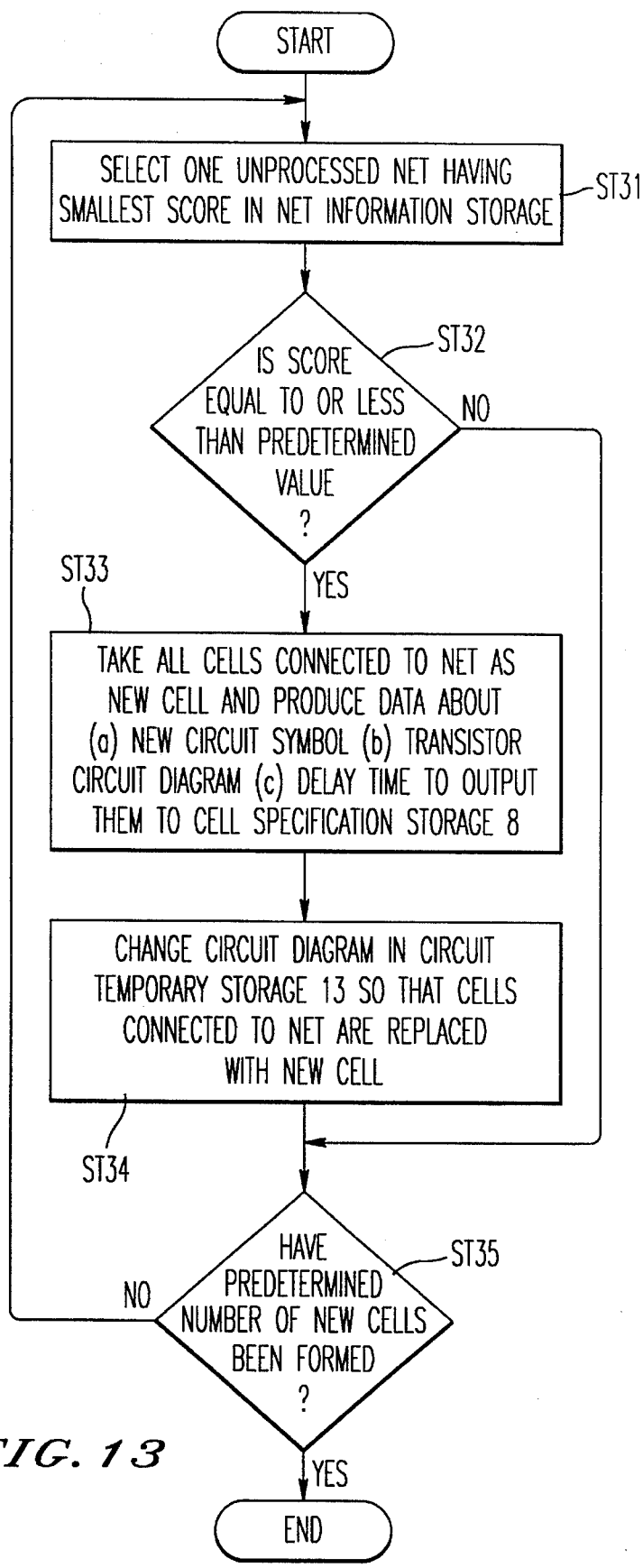
FIG. 13 is a flow chart showing the operation of a net searcher shown in FIG. 8.

FIG. 13 is a flow chart for detailing the operation of the cell replacement unit 19. One unprocessed net is selected which has the smallest score in the net information storage 18 (the step ST31). Whether the score is not more than a predetermined value is judged (the step ST32). The judgement is made because an excessive number of transistors hinder the cell generator 9 from successive cell production.

If the predetermined value of the scores is 8, the nets N8 and N3 of Table 2 are processed because their scores are less than the predetermined value. A circuit including all of the cells connected to the nets N8, N3 is taken as a new cell, and data about new circuit symbol, transistor circuit diagram and delay time for the new cell are produced and outputted to the cell specification storage 8 (the step ST33).

The circuit diagram in the circuit temporary storage 13 is changed so that the cells connected to the net are replaced with the new cell (the step ST34). The flow proceeds to the step ST35 if it is judged that the score is more than the predetermined value in the step ST31.

It is then judged whether a predetermined number of new cells are produced or whether there are no unprocessed nets (the step ST35). If the predetermined number of new cells have been produced or there is no unprocessed nets, the cell replacement unit 19 terminates its operation. If the predetermined number of new cells have not been produced and there is an unprocessed net, the flow returns to the step ST31 to continue the processing.

Upon sufficient changes of the circuit in the circuit temporary storage 13 as stated above, the circuit output unit 20 outputs the circuit data in the circuit temporary storage 13 to the equivalent circuit storage 7.

For example, the cells connected to the net N3 of FIG. 10 (the cells 50, 51 of FIG. 2) are replaced with the cell 55 of FIG. 4 by the cell replacement unit 19.

Although the respective units 13 to 20 of FIG. 8 are discrete, a general-purpose computer may be used which comprises the file storage 10, the central arithmetic unit 11, and the memory 12 as shown in FIG. 6. In the computer of FIG. 6, the circuit input unit 14, path analyzer 15, net searcher 17, cell replacement unit 19, and circuit output unit 20 are implemented in the form of a program executed by the central arithmetic unit 11, and the circuit temporary storage 13, path delay information storage 16, and net information storage 18 are implemented in the form of the file storage 10 and memory 12. It should be noted that the respective units 14, 15, 17, 19 may be implemented in the form of discrete programs or, alternatively, some of them may be combined into one program.

Figure 9:
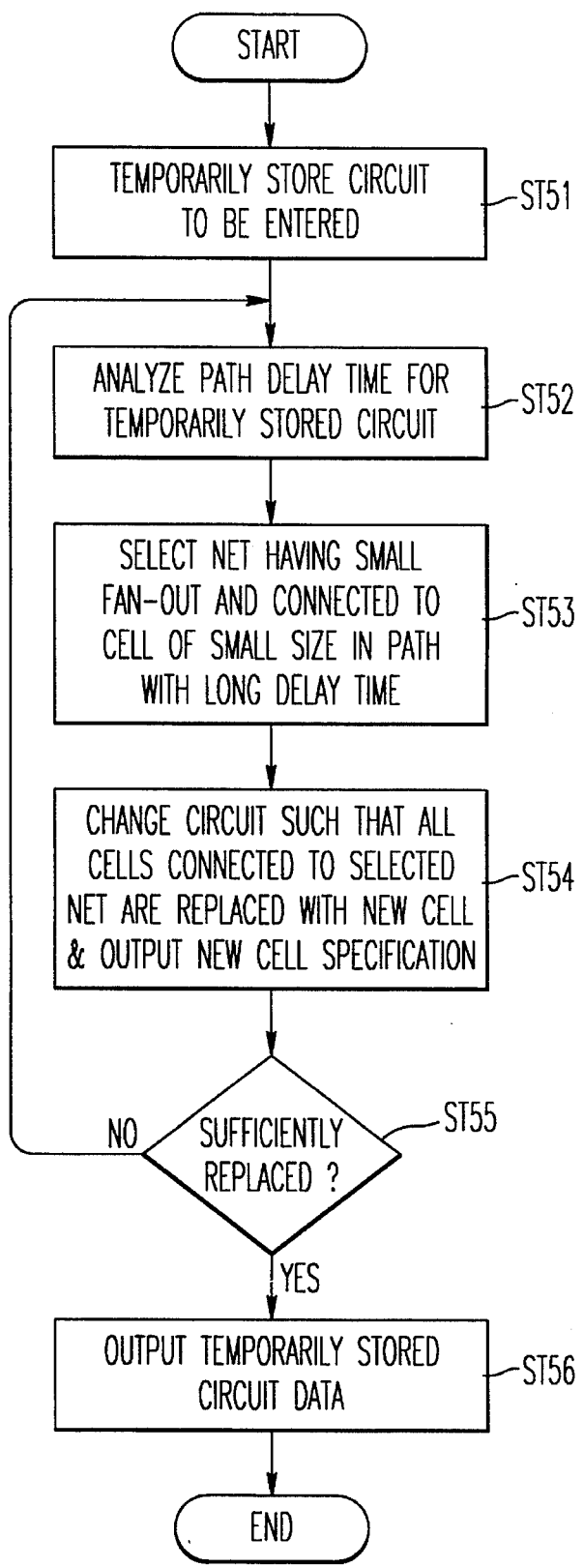
FIG. 9 is a flow chart showing the operation of the CPU for implementing the circuit converter of FIG. 8.

The operation of the central arithmetic unit 11 is described below with reference to the flow chart of FIG. 9. Starting the flow of FIG. 9, circuit data to be entered are read for temporary storage in the step ST51. The signal propagation delay time of paths is analyzed for the temporarily stored circuit in the step ST52. In the step ST53, nets of the path having the long delay time on the circuit are searched for to select some nets, the fan-out of which is as small as possible and which are connected to the cell whose size is as small as possible.

The temporarily stored circuit data are changed such that all cells connected to each selected net are replaced with a new cell in the step ST54. The new cell specification is outputted in the form of circuit data. Whether further circuit replacement is necessary is judged in the step ST55. If it is necessary, the flow returns to the step ST52. If it is not necessary, the flow proceeds to the step ST56. The temporarily stored circuit data are outputted in the step ST56.

While the invention has been shown and described in detail, the foregoing description is in all aspects illustrative and not restrictive. It is therefore understood that numerous modifications and variations can be devised without departing from the scope of the invention.

What is claimed is:

1. A device for automatically designing a semiconductor integrated circuit, said device including a placement and routing unit for determining the arrangement of cells and lines on an integrated circuit chip on the basis of data of cells stored in a cell library storage and data of a circuit stored in a circuit storage, said device comprising:

a circuit converter for generating data of an equivalent circuit having cells smaller in total number than those of said circuit by the use of a new cell which is not stored in said cell library storage on the basis of said circuit formed by connecting only the cells stored in said cell library storage to apply said data of said equivalent circuit to said placement and routing unit, said circuit converter producing a specification of said new cell; and a cell generator for producing data required to register said new cell in said cell library storage on the basis of said new cell specification.

2. The device of claim 1, further comprising:

a cell specification storage for storing said new cell specification produced by said circuit converter to output said new cell specification to said circuit converter and said cell generator as needed, said circuit converter producing said new cell specification on the basis of both said data of the cells stored in said cell library storage and said specification of the cells stored in said cell specification storage.

3. The device of claim 2, further comprising:

an equivalent circuit storage for storing said data of said equivalent circuit produced by said circuit converter, said placement and routing unit determining the arrangement of the cells and lines on the integrated circuit chip on the basis of said data of the cells stored in said cell library storage and said data of said equivalent circuit stored in said equivalent circuit storage.

4. The device of claim 3, further comprising:

a circuit verifier for simulating the operation of said equivalent circuit stored in said equivalent circuit storage on the basis of said data of the cells stored in said cell library storage to verify said equivalent circuit.

5. The device of claim 1, wherein said circuit converter includes:

a path analyzer for analyzing a signal propagation delay time for all paths in said circuit;

a net searcher for searching for a net having a smaller fan-out than predetermined fan-out on a path having a longer signal propagation delay time than predetermined delay time; and a cell replacement unit for changing a part of said circuit until all of the cells connected to the searched net are replaced with said new cell.

6. The device of claim 5, wherein said circuit converter further includes a circuit temporary storage for temporarily storing said circuit stored in said circuit storage, and said cell replacement unit rewrites said circuit data stored in said circuit temporary storage each time the cells are replaced.

7. The device of claim 6, wherein said cell replacement unit functions to produce a transistor circuit diagram for said new cell.

8. The device of claim 6, wherein said cell replacement unit functions to calculate a delay time for said new cell.

9. The device of claim 6, wherein said circuit converter further includes a path delay information storage for storing said paths and said signal propagation delay times analyzed by said path analyzer in descending order of the signal propagation delay time, and said net searcher searches nets in descending order of said signal propagation delay time stored in said path delay information storage.

10. The device of claim 9, wherein
said net searcher searches for a net connected to a cell including a small number of transistors as well as having the small fan-out.

11. The device of claim 10, wherein
said net searcher functions to apply a score to the searched net in accordance with the fan-out and the number of transistors forming the cell.

12. The device of claim 11, wherein
said circuit converter further includes a net information storage for storing the net searched by said net searcher and the score together.

13. The device of claim 12, wherein
said net searcher functions to converting a pair of an AND gate and an NOR gate and a pair of an OR gate and an NAND gate into CMOS complex gates, respectively, if the output of the AND gate is connected to an input of the NOR gate with said searched net and if the output of the OR gate is connected to an input of the NAND gate with said searched net.

14. A device for designing a semiconductor integrated circuit, comprising:
a placement and routing unit for determining an arrangement of cells and lines on an integrated circuit chip, based on data of cells stored in a cell library storage and data of a circuit stored in a circuit storage;
a circuit converter for generating data of an equivalent circuit having cells smaller in total number than those of said circuit by use of a new cell, said new cell being based on said circuit formed by connecting only the cells stored in said cell library storage, and applying said data of said equivalent circuit to said placement and routing unit, said circuit converter producing a specification of said new cell;
an equivalent circuit storage for storing data of the equivalent circuit from the circuit converter; and
a cell generator for producing data required to register said new cell in said cell library storage based on said new cell specification.

15. The device of claim 14, further comprising:
a cell specification storage for storing said new cell specification produced by said circuit converter to output said new cell specification to said circuit converter and said cell generator,
said circuit converter producing said new cell specification based on both said data of the cells stored in said cell library storage and said specification of the cells stored in said cell specification storage.

16. The device of claim 15, wherein said placement and routing unit determines the arrangement of the cells and lines on the integrated circuit chip based on said data of the cells stored in said cell library storage and said data of said equivalent circuit stored in said equivalent circuit storage.

17. The device of claim 16, further comprising:
a circuit verifier for simulating operation of said equivalent circuit stored in said equivalent circuit storage based on said data of the cells stored in said cell library storage to verify said equivalent circuit.

18. The device of claim 14, wherein said circuit converter comprises:
a path analyzer for analyzing a signal propagation delay time for all paths in said circuit;
a net searcher for searching for a net having a smaller fan-out than a predetermined fan-out on a path having a longer signal propagation delay time than a predetermined delay time; and
a cell replacement unit for changing a part of said circuit until all of the cells connected to the searched net are replaced with said new cell.

19. The device of claim 18, wherein said circuit converter further comprises:
a circuit temporary storage for temporarily storing said circuit stored in said circuit storage; and
wherein said cell replacement unit rewrites said circuit data stored in said circuit temporary storage each time the cells are replaced.

20. The device of claim 19, wherein said cell replacement unit functions to produce a transistor circuit diagram for said new cell.

21. The device of claim 19, wherein said cell replacement unit functions to calculate a delay time for said new cell.

22. The device of claim 19, wherein said circuit converter comprises:
a path delay information storage for storing said paths and said signal propagation delay times analyzed by said path analyzer in descending order of the signal propagation delay time; and
said net searcher searches nets in descending order of said signal propagation delay time stored in said path delay information storage.

23. The device of claim 22, wherein said net searcher searches for a net connected to a cell including a small number of transistors as well as having the small fan-out.

24. The device of claim 23, wherein said net searcher functions to apply a score to the searched net in accordance with the fan-out and the number of transistors forming the cell.

25. The device of claim 24, wherein said circuit converter further includes a net information storage for storing the net searched by said net searcher and the score together.

26. The device of claim 24, wherein said net searcher functions to convert a pair of an AND gate and an NOR gate and a pair of an OR gate and an NAND gate into CMOS complex gates, respectively, if the output of the AND gate is connected to an input of the NOR gate with said searched net and if the output of the OR gate is connected to an input of the NAND gate with said searched net.

* * * * *